United States Patent [19]

Steele et al.

[11] Patent Number: 5,809,281

[45] Date of Patent: Sep. 15, 1998

[54] FIELD PROGRAMMABLE GATE ARRAY WITH HIGH SPEED SRAM BASED CONFIGURABLE FUNCTION BLOCK CONFIGURABLE AS HIGH PERFORMANCE LOGIC OR BLOCK OF SRAM

[75] Inventors: Randy Charles Steele; Duane H. Chinnow, Jr., both of Folsom, Calif.

[73] Assignee: Altera Corporation, San Jose, Calif.

[21] Appl. No.: 790,271

[22] Filed: Jan. 28, 1997

Related U.S. Application Data

[63] Continuation of Ser. No. 39,972, Mar. 30, 1993, abandoned.

[51] Int. Cl.$^6$ .................................................... G06F 12/00
[52] U.S. Cl. .............................. 395/497.01; 340/825.83; 326/39
[58] Field of Search .................................... 395/431, 432, 395/497.01; 365/189.08, 63, 72, 51; 326/39, 40, 46; 340/825.79, 825.83, 825.84, 825.86, 825.87, 825.89; 364/716

[56] References Cited

U.S. PATENT DOCUMENTS

| | | | |
|---|---|---|---|
| 4,642,487 | 2/1987 | Carter | 307/465 |
| 4,706,216 | 11/1987 | Carter | 365/94 |
| 4,758,985 | 7/1988 | Carter | 365/94 |
| 4,870,302 | 9/1989 | Freeman | 307/465 |
| 5,128,559 | 7/1992 | Steele | 307/465 |
| 5,258,668 | 11/1993 | Cliff et al. | 307/465 |
| 5,260,610 | 11/1993 | Pedersen et al. | 307/465 |
| 5,313,119 | 5/1994 | Cooke et al. | 326/41 |
| 5,338,982 | 8/1994 | Kawana | 326/45 |
| 5,343,437 | 8/1994 | Johnson et al. | 365/230.03 |
| 5,357,132 | 10/1994 | Turner | 257/305 |
| 5,362,999 | 11/1994 | Chiang | 326/44 |
| 5,365,125 | 11/1994 | Goetting et al. | 326/39 |

OTHER PUBLICATIONS

"Optimized Reconfigurable Cell Array (ORCA) Series Field–Programmable Gate Arrays," *Advance Data Sheet,* Feb. 1993, AT&T Microelectronics, pp. 1–87.

*The Programmable Logic Data Book*, Xilnx, Inc., 1994, pp. 2-5-2-102.

*Primary Examiner*—Jack B. Harvey
*Assistant Examiner*—Ario Etienne
*Attorney, Agent, or Firm*—Townsend and Townsend and Crew LLP

[57] ABSTRACT

A field programmable gate array (FPGA) includes a number of configurable function blocks, each separately configurable by the user of the FPGA as either high performance programmable logic or a block of SRAM. In accordance with the present invention, each configurable function block includes a volatile logic array comprised of an array of "AND" gates and an array of "OR" gates with programmable connections. The programmable connections in the volatile logic array comprise SRAM cells. These SRAM cells are then capable of serving the user of the FPGA in two modes of operation. In a first mode of operation, logic mode, the SRAM cells provide for the programmable connections which direct the logic operations in the volatile logic array. In a second mode of operation, memory mode, the SRAM cells function as a block of SRAM which can then be written to, and read from, using standard SRAM access signals.

28 Claims, 16 Drawing Sheets

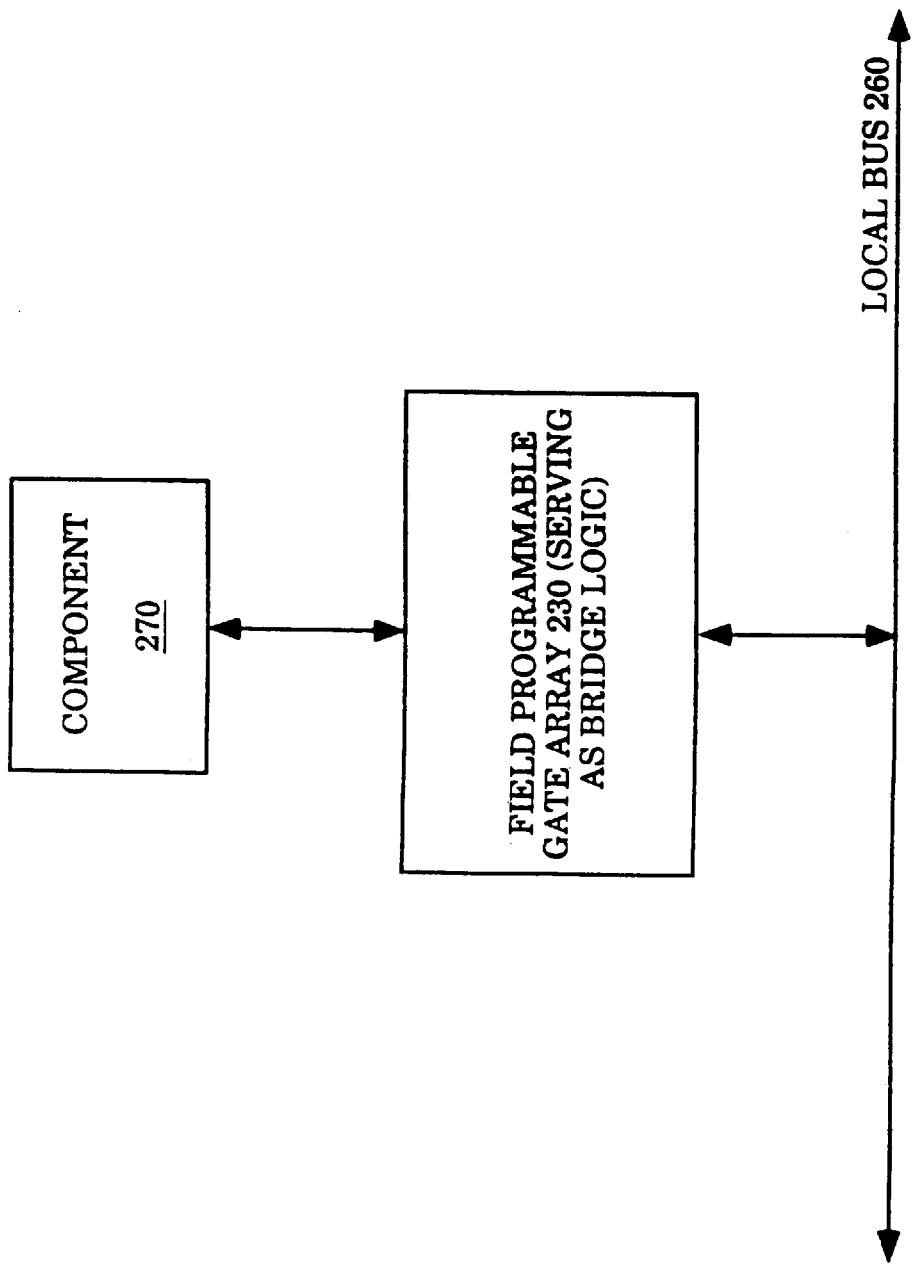

FIELD PROGRAMMABLE GATE ARRAY WITH HIGH SPEED SRAM BASED CONFIGURABLE FUNCTION BLOCK CONFIGURABLE AS HIGH PERFORMANCE LOGIC OR BLOCK OF SRAM

This is a continuation of application Ser. No. 08/039,972, filed Mar. 30, 1993, now abandoned.

BACKGROUND OF THE INVENTION

1. Field of the Invention

The present invention relates to field programmable gate arrays, and more particularly, to a field programmable gate array incorporating configurable function blocks, each one separately configurable as either high performance programmable logic or a block of SRAM.

2. Art Background

Programmable logic chips can take many forms. One such form is commonly referred to as a programmable logic device, or "PLD." Most programmable logic devices (PLD's) are internally structured as variations on an architecture which utilizes a programmable logic array. A programmable logic array makes use of the fact that any logic equation can be converted into an equivalent "sum-of-products" form and thus implemented through the use of interconnected "AND" and "OR" gates. The programmable logic array architecture utilizes programmable connections such that a user can selectively determine the inputs into an array of "AND" gates connected to an array of "OR" gates. The architecture of a PLD utilizing a programmable logic array also typically includes feedback options which allow the user greater flexibility to implement sequential logic functions.

The programmable connections in a PLD using a programmable logic array architecture are fixed in number and location within the logic array. However, whether these programmable connections are in an open or closed state is determined by the user of the PLD. In particular, the user programs the PLD by specifying which of these connections he would like to remain open, and which he would like to close. Programmability, it will be appreciated, allows for instant customization, very similar to user programmable memories such as PROM's or EPROM's. In effect, a user can purchase a PLD chip off-the-shelf, use a programming system running, for example, on a personal computer, and in a matter of a few hours, have a customized logic chip in his hands. Using a PLD can advantageously reduce the chip count needed to implement logic, saving board space and resulting in smaller system physical dimensions. A reduced chip count can additionally contribute to faster system speeds, lower power consumption, and higher reliability. A PLD can further provide for increased flexibility, allowing the user to upgrade the system without rendering the logic obsolete. In such circumstances, the PLD is simply reprogrammed.

A second form of programmable logic chip, a field programmable gate array, or "FPGA," comprises a number of programmable logic blocks coupled together with means for selectively routing signals to and from the programmable logic blocks. The number and nature of the programmable logic blocks, as well as the means chosen for selectively routing signals to and from the programmable logic blocks is dependent upon the particular architecture chosen for the FPGA. In the past, FPGA's have not provided particularly fast logic, typically running in the 10–20 MHz range. As a result, prior art FPGA's have often been used in the peripheral areas of computer systems to integrate logic otherwise requiring numerous PLD chips, onto a single FPGA chip.

As will be described, the present invention provides for a high performance FPGA chip incorporating a plurality of configurable function blocks coupled to a global interconnect matrix. Each one of these configurable function blocks incorporates a volatile logic array architecture based upon static random access memory (SRAM). In accordance with the apparatus and method of the present invention, each one of these configurable function blocks is configurable as either high performance programmable logic or a block of SRAM which the user can then write to, and read from, as he would a conventional block of SRAM.

SUMMARY OF THE INVENTION

The present invention finds application in the area of programmable logic, and in particular, in the area of field programmable gate array chips. The field programmable gate array chip of the present invention is comprised of a number of configurable function blocks connected to a single global interconnect matrix. Each configurable function block includes a non-volatile architectural element for programming the desired logic equations, a volatile logic array with programmable connections based upon SRAM cells, and macrocell circuitry providing for the output of signals.

In accordance with the present invention, the user of the FPGA chip is provided with the option of configuring each one of the configurable function blocks as either high performance programmable logic, or a block of SRAM. When configuring a configurable function block as high performance programmable logic, the user can initially program the desired equations into non-volatile cells in the non-volatile architectural element. Upon power up, the desired architectural configuration is then transferred from the non-volatile architectural element into the SRAM cells in the volatile logic array. For power savings, the architectural configuration in the non-volatile cells of the non-volatile architectural element are then turned off. The SRAM cells thus are in the "speed path" such that they determine the desired connections in the logic array when the desired logic equations are performed.

When the user of the field programmable gate array chooses to configure a configurable function block as a block of SRAM, SRAM cells in the volatile logic array are utilized to store data, rather than determine programmable connections. Row and column decoder circuitry is provided in the configurable function block such that the SRAM cells can be selectively written to, and read from, as a block of SRAM. Accordingly, the present invention provides for a field programmable gate array incorporating a plurality of configurable function blocks, each one configurable as either high performance programmable logic or a block of SRAM.

BRIEF DESCRIPTION OF THE DRAWINGS

Further details are explained below with the help of the examples illustrated in the attached drawings in which:

FIG. 15 illustrates the use of the field programmable gate array as a bridge between a component and a local bus.

DETAILED DESCRIPTION OF THE INVENTION

A field programmable gate array with configurable function blocks, each separately configurable as either high performance programmable logic or a block of SRAM is described. In the following description, for purposes of explanation, numerous details are set forth such as specific bit values, data paths, data word sizes, etc. in order to provide a thorough understanding of the present invention. However, it will be apparent to one skilled in the art that such specific details are not essential to the practice of the present invention. In other instances, in a number of figures, well known electrical structures and circuits are shown in block diagram form in order not to obscure the present invention unnecessarily.

Figure 1:
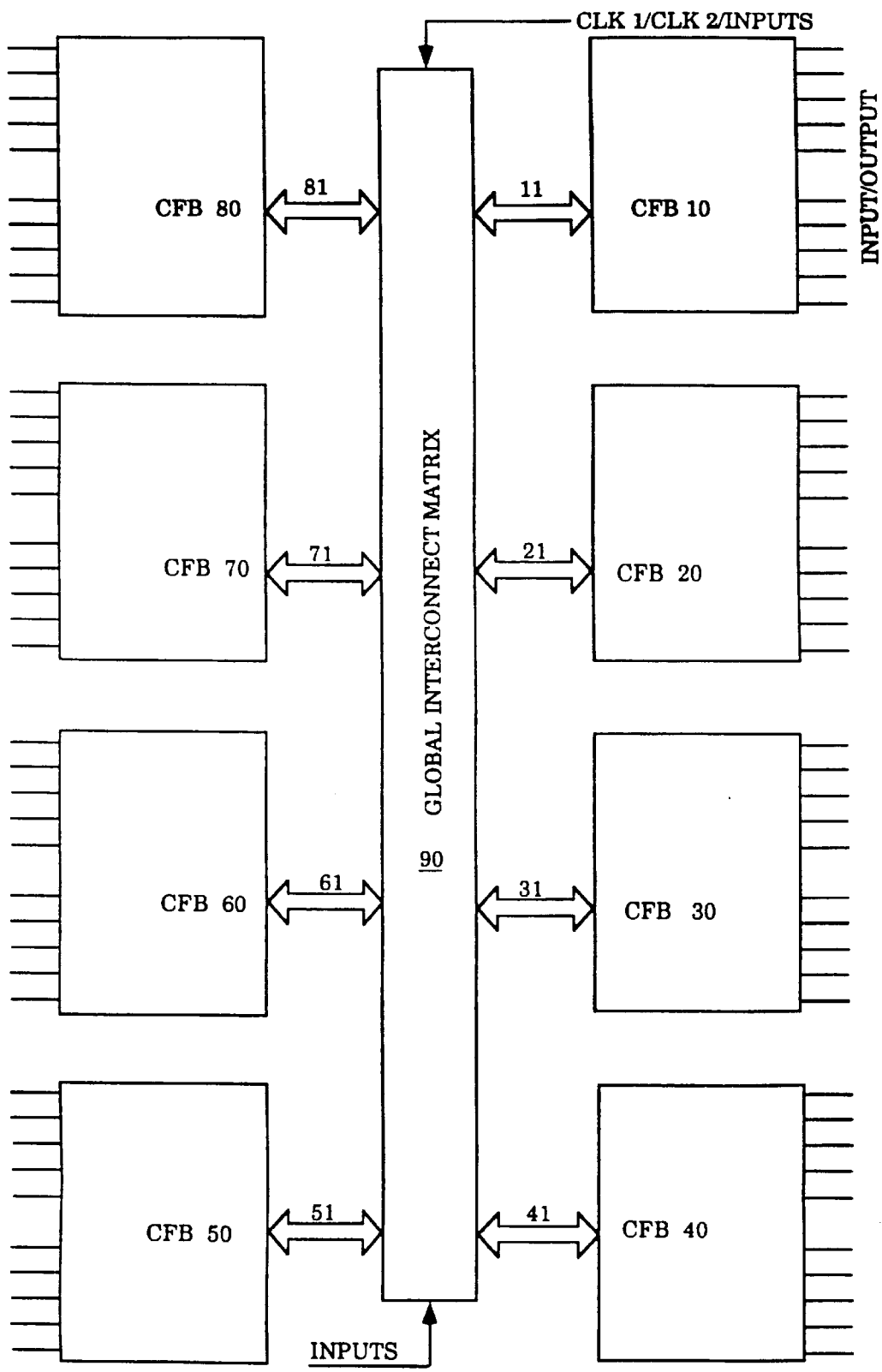
FIG. 1 illustrates, in block diagram form, the overall architecture of the field programmable gate array (FPGA) of the present invention.

Referring now to FIG. 1, this figure illustrates, in block diagram form, the overall architecture of the field programmable gate array (FPGA) of the present invention. As shown, the field programmable gate array (FPGA) chip 100 is comprised of eight configurable function blocks (CFB's) 10, 20, 30, 40, 50, 60, 70, and 80, coupled to a global interconnect matrix 90. In particular, configurable function blocks (CFB's) 10, 20, 30, 40, 50, 60, 70, and 80, are coupled to global interconnect matrix 90, with associated buses 11, 21, 31, 41, 51, 61, 71, and 81, respectively. In the embodiment of the present invention illustrated in FIG. 1, each CFB has ten outputs, each of which is coupled to an input/output pin of FPGA chip 100.

Continuing to refer to FIG. 1, global interconnect matrix 90 is comprised of buffering logic and switches that selectively couple specified signals to particular CFB's. Global interconnect matrix 90 is fully connectable to any pin of FPGA chip 100. Thus, the INPUTS of global interconnect matrix 90 include any of the CFB outputs, thereby providing for feedback between the CFB's (feedback lines not shown). This high degree of connectivity between CFB blocks eliminates routing problems during rework of a complex design. Pinouts for FPGA chip 100 do not have to change because of routing restrictions.

Continuing to refer to FIG. 1, as will be described, in accordance with the present invention, each configurable function block (CFB) can be configured by the user of FPGA chip 100 as either high performance programmable logic or a block of SRAM. Thus, the user of FPGA chip 100 has the choice of operating each CFB in at least two different modes. In a first mode referred to as "logic mode," the user configures and operates the CFB as high performance programmable logic. When a CFB is configured by a user to operate in logic mode, the CFB is programmable like a programmable logic device (PLD) allowing the user to implement a substantial number of Boolean equations on a substantial number of input signals. Thus, in logic mode, a CFB can be compared to a separate programmable logic device (PLD) that can be programmed to execute logic equations by the user of FPGA chip 100. In a second, alternative mode, termed "memory mode," the user configures and operates the CFB as a block of SRAM. This block of SRAM can then be read from, and written to, in accordance with standard SRAM commands.

Figure 2:
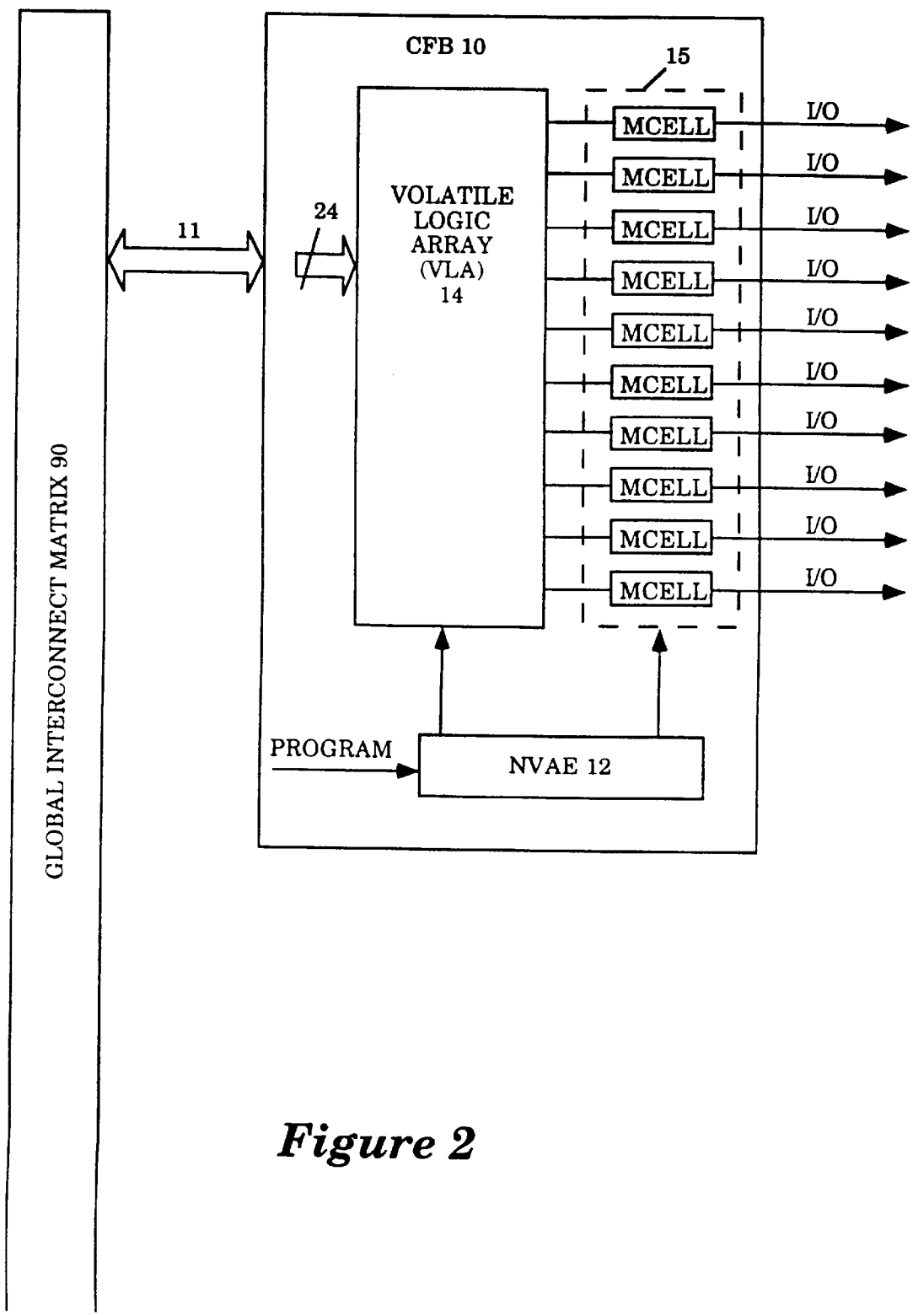
FIG. 2 illustrates, in block diagram, the composition of an exemplary configurable function block.

Referring now to FIG. 2, this figure illustrates, in block diagram, the composition of exemplary CFB 10, which is similar in composition to the other CFB's. As shown, CFB 10 comprises three general blocks: a non-volatile architectural element (NVAE) 12, a volatile logic array (VLA) 14, and macrocell circuitry 15. Non-volatile architectural element (NVAE) 12 is comprised of, for example, erasable programmable read only memory (EPROM) or electrically erasable programmable read only memory (EEPROM). In contrast, volatile logic array (VLA) 14 is comprised of an array of "AND" gates connected to an array of "OR" gates with programmable connections (not shown in this figure). In the present invention, the programmable connections in volatile logic array (VLA) 14 comprise volatile memory cells, for example, static random access memory (SRAM) cells. Macrocell circuitry 15 comprises circuitry, including registers, which provides for the output of signals from the volatile logic array 14, as well as feedback to the global interconnect matrix 90.

In accordance with the present invention, if the user of FPGA chip 100 wants CFB 10 to serve as high performance programmable logic, the user initially programs the desired logic equations into CFB 10. In accordance with a first process of programming, the actual architectural configuration corresponding to these desired logic equations is initially programmed into non-volatile architectural element (NVAE) 12. In the present invention, the non-volatile memory in non-volatile architectural element (NVAE) 12 is not, thereafter, in the "speed" path when the desired logic equations in CFB 10 are eventually performed. Thus, for example, when CFB 10 ultimately performs the desired logical equations, the EPROM in non-volatile architectural element (NVAE) 12 is not repeatedly referenced in the performance of the desired logic equations in CFB 10.

Instead, after FPGA chip 100 has been programmed by the user, and is thereafter switched on for use, the configuration corresponding to the desired logic equations programmed into non-volatile architectural element 12 is transferred into volatile memory cells (e.g. SRAM) in volatile logic array (VLA) 14. It is these volatile memory cells in volatile logic array (VLA) 14 which are then used directly in the "speed path" when performing the desired logic equations in CFB 10. As described earlier, it is these volatile memory cells which serve as the "programmable" connections in volatile logic array (VLA) 14. The programmability of FPGA chip 100 extends to the macrocell circuitry 15 which also receives configuration bits from non-volatile architectural element (NVAE) 12 on power up. In particular, each macrocell in macrocell circuitry 15 can be configured as either a fast combinatorial block, a D-register, or a Toggle flip-flop.

Figure 3A:
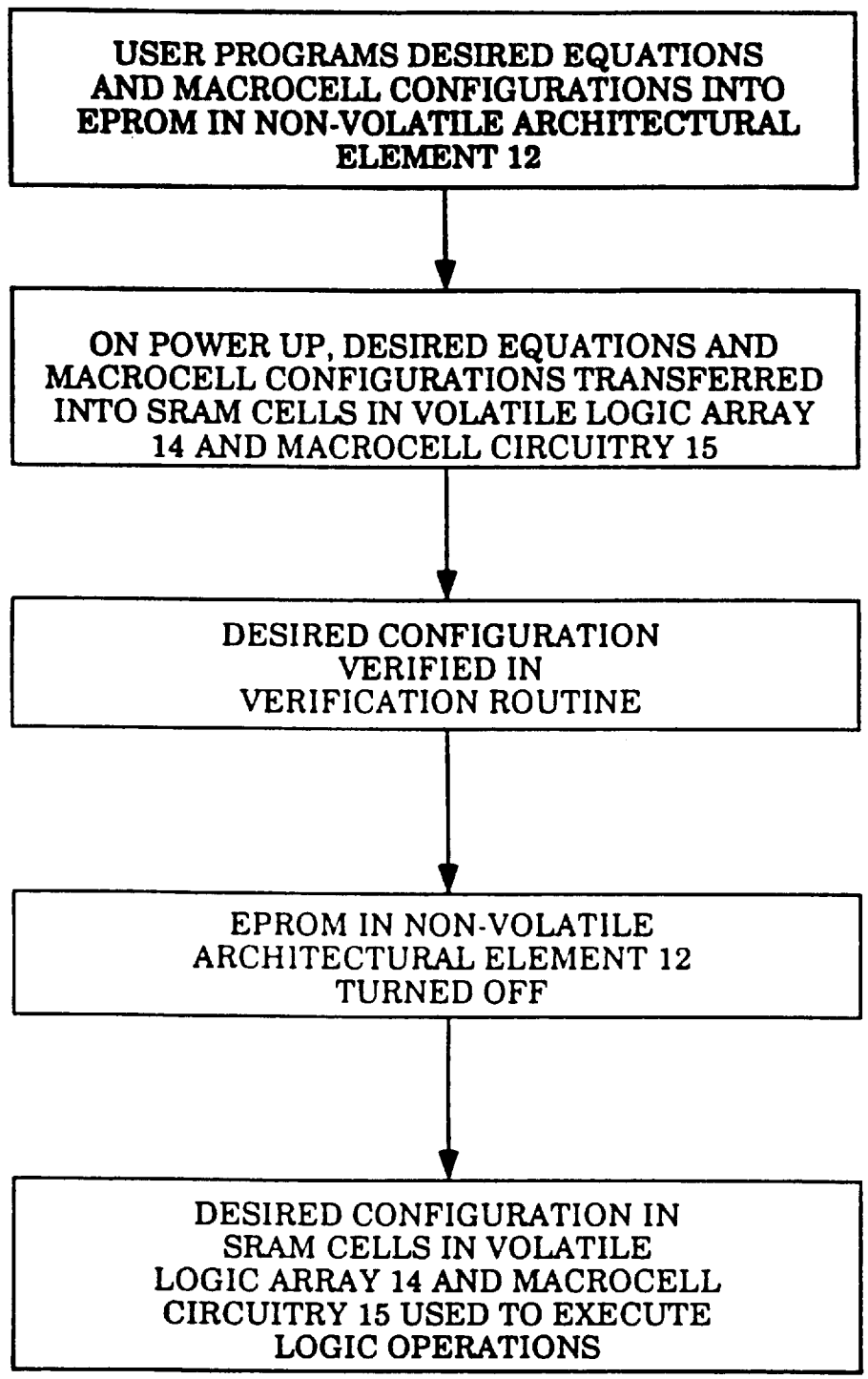
FIG. 3A illustrates a first process of programming a configurable function block when configured to function in logic mode.

This first process of programming configurable function block (CFB) 10 when in logic mode is summarized in greater detail in FIG. 3A. Initially, the user of FPGA chip 100 programs the desired logic equations and macrocell configurations into EPROM (non-volatile memory) in non-volatile architectural element 12. When FPGA chip 100 is then powered up for use, the configuration programmed into the EPROM is transferred into SRAM cells in volatile logic array (VLA) 14 and macrocell circuitry 15. Following this transfer, the desired configuration is verified through a verification routine. Following verification, the EPROM's in non-volatile architectural element 12 are turned off to reduce power consumption. The desired configuration, now stored in the SRAM cells of volatile logic array (VLA) 14 and macrocell circuitry 15, is then used to execute the desired logic operations.

It will be appreciated by those skilled in the art that the present invention provides for reduced power consumption in FPGA chip 100 by utilizing SRAM cells rather than EPROM cells as the "programmable" connections in volatile logic array 14. This is so because SRAM cells burn considerably less power than EPROM cells. As such, the present invention advantageously utilizes EPROM cells only briefly, at power up, to configure SRAM cells, then turns the EPROM cells off. Accordingly, the present invention provides for high performance programmable logic that consumes relatively low power. As a result of this low power consumption, the FPGA of the present invention is more readily scalable to larger sizes than architectures which use EPROM cells in the speed path.

It will additionally be appreciated by those skilled in the art that because the programmable connections in volatile logic array 14 are not EPROM, but instead, SRAM, alternative logic configurations can be downloaded into volatile logic array 14 following power up by simply changing the status of particular SRAM cells in volatile logic array 14. These logic configurations would then be temporary in the sense that following power down, and subsequent power up, the logic configuration loaded into the SRAM cells would, again, be the original one contained in the EPROM in non-volatile element 12.

It will further be appreciated that the SRAM cells in the present invention are used to determine the programmable connections in an array of "AND" gates and an array of "OR" gates in order to implement a user's logic equations in sum of products fashion. The SRAM cells, therefore, are an integral part of a high speed logic array, and are not simply functioning as look-up tables which indirectly implement logic functions. Accordingly, the configurable function block of the present invention implements high performance programmable logic with SRAM cells used to programmably determine connections in a high speed logic array.

The use of SRAM cells to determine the programmable connections in the volatile logic array 14 of CFB 10 directly and advantageously supports the previously described second mode of operation for CFB 10. Thus, in accordance with the present invention, the user of FPGA 100 can choose to configure CFB 10 as a block of SRAM, rather than as high performance programmable logic. When the user chooses to utilize CFB 10 as a block of SRAM, selected SRAM cells in volatile logic array 14 are used for the storage of data rather than to determine connections in a high performance programmable logic array.

Figure 3B:
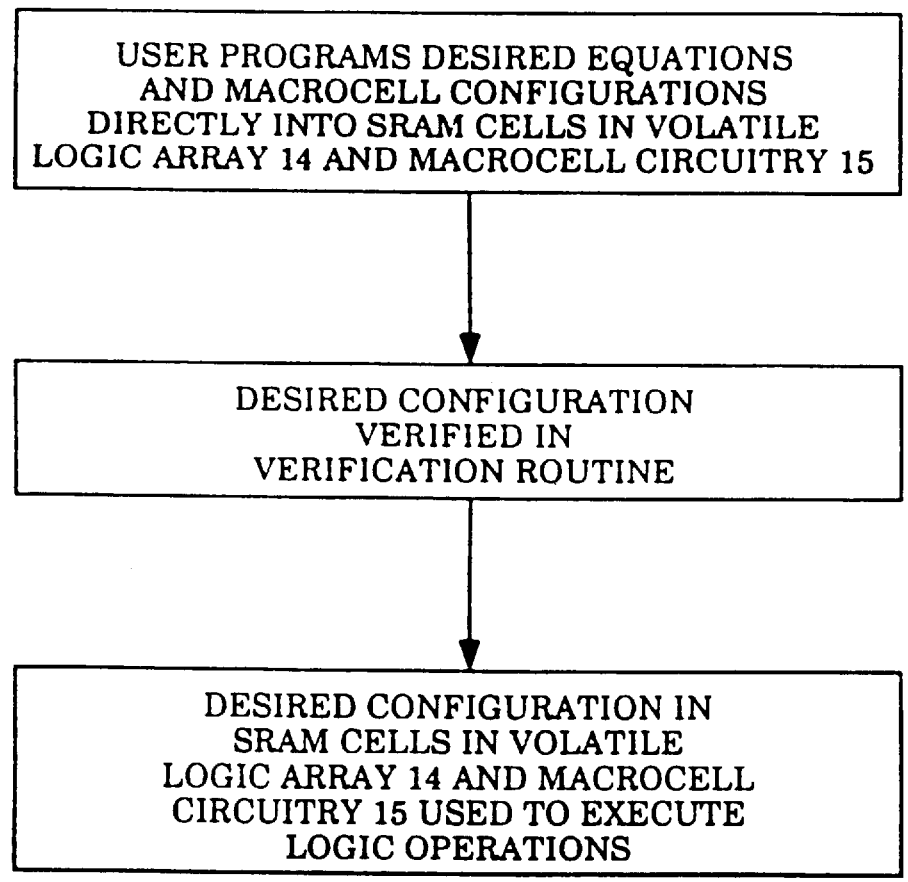
FIG. 3B illustrates a second process of programming a configurable function block when configured to function in logic mode.

A second, alternative process of programming configurable function block (CFB) 10 when in logic mode is summarized in FIG. 3B. In this second alternative process, the user of FPGA chip 100 programs the desired logic equations and macrocell configurations directly into the SRAM cells in volatile logic array 14. The desired configuration is then verified through a verification routine. The desired configuration, now stored in the SRAM cells of volatile logic array (VLA) 14 and macrocell circuitry 15, is then used to execute the desired logic operations.

Figure 4:
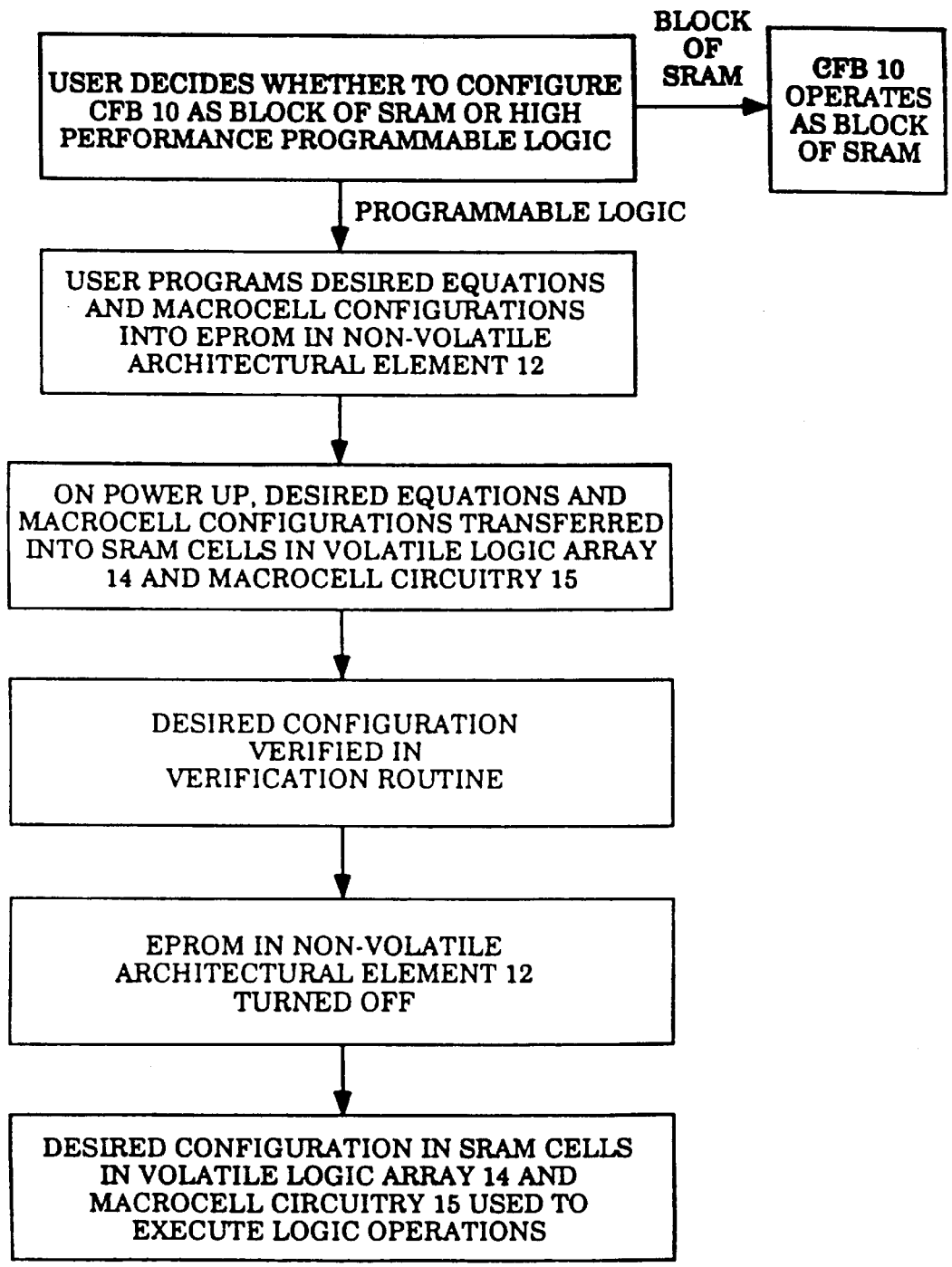
FIG. 4 illustrates the added option of configuring the configurable function block as a block of SRAM.

With reference now to FIG. 4, this figure illustrates the added option of using CFB 10 as either high performance programmable logic or a block of SRAM. In particular, it will be appreciated that FIG. 4 resembles FIG. 3A except that the user now initially decides whether to configure CFB 10 as a block of SRAM or high performance programmable logic. The ability to configure each CFB as either high performance programmable logic or a block of SRAM offers the user of FPGA 100 with substantially enhanced design capabilities.

Figure 5:
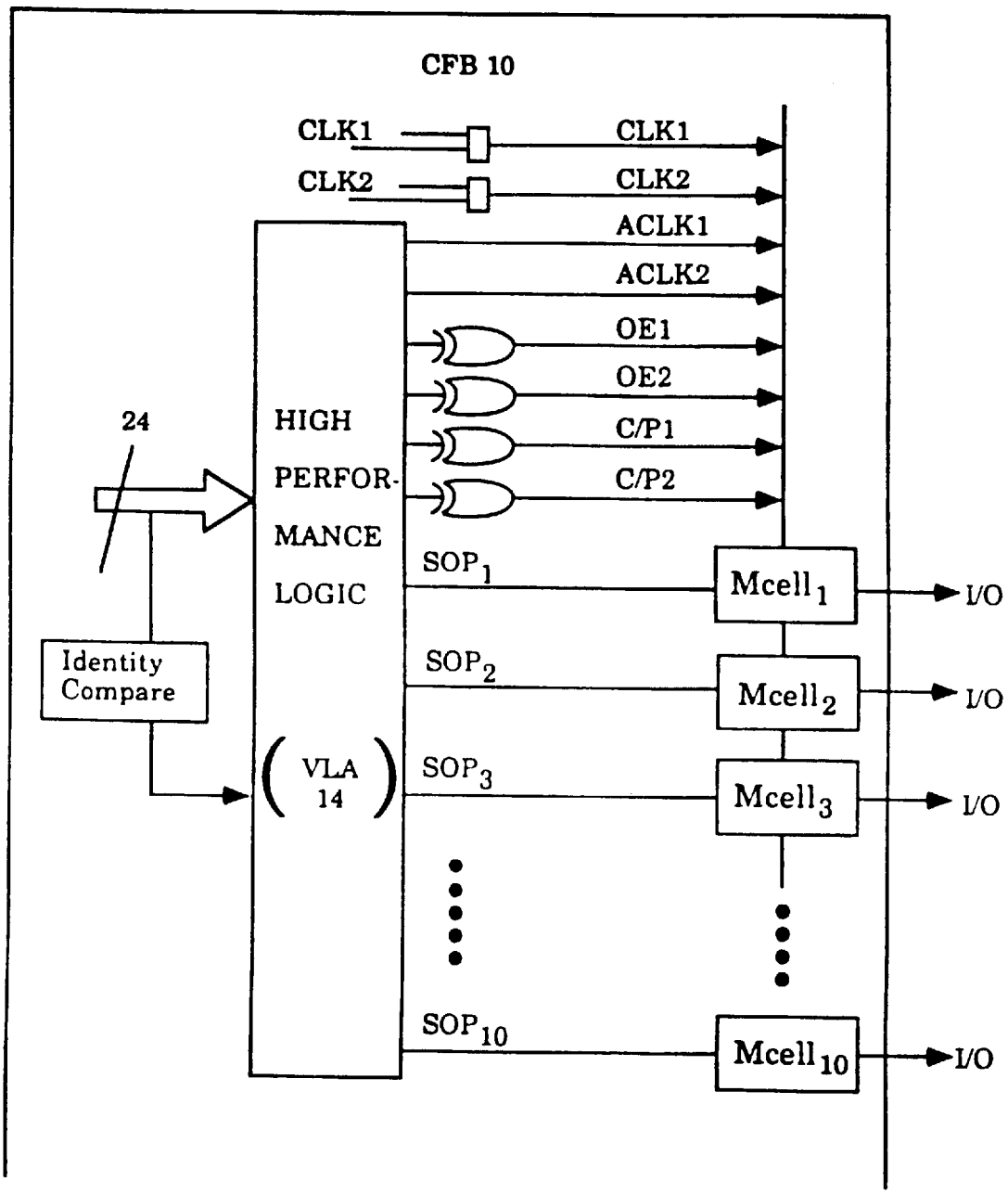
FIG. 5 illustrates a configurable function block (CFB) of the present invention configured to operate in logic mode.
Figure 6:
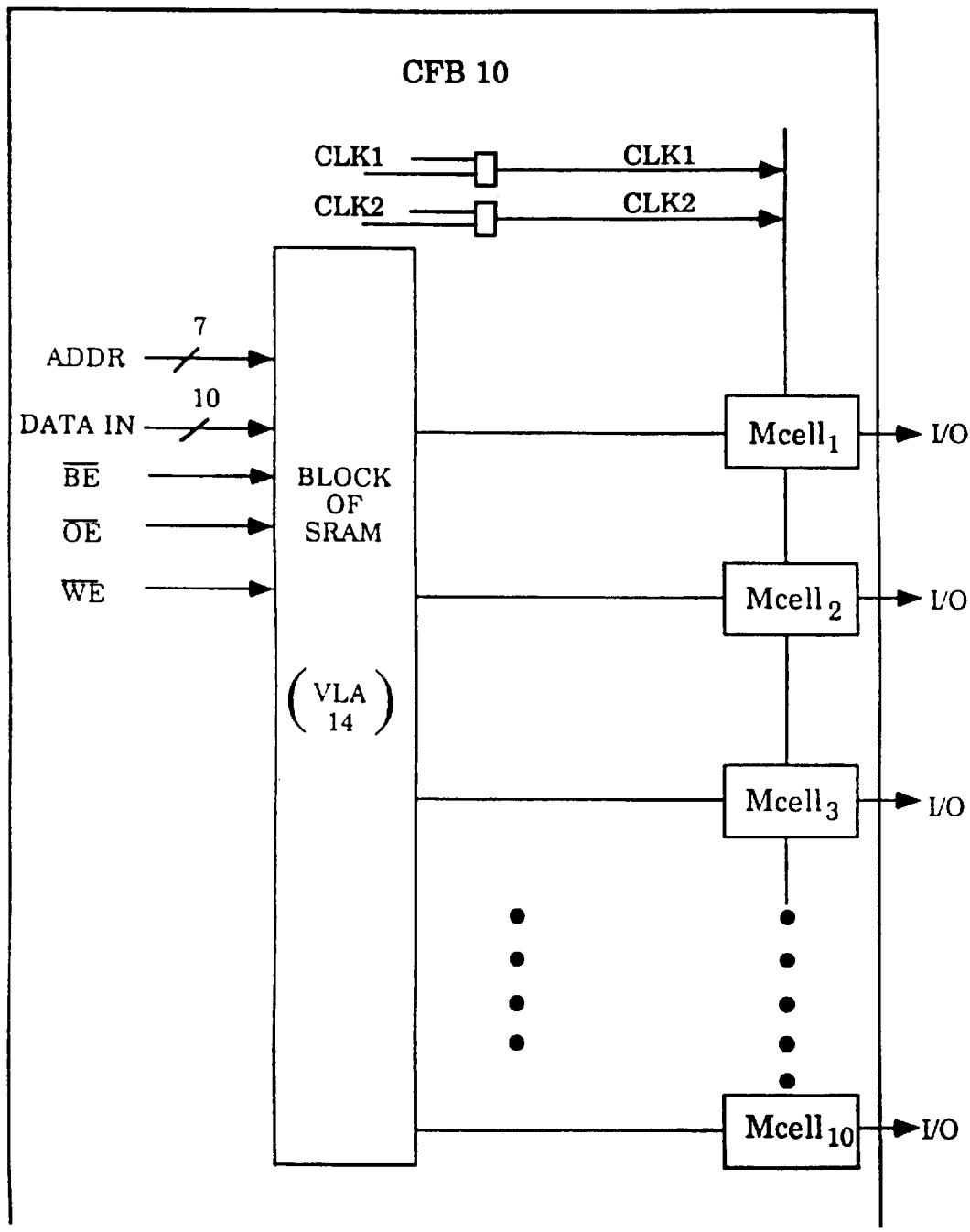
FIG. 6 illustrates a configurable function block (CFB) of the present invention configured to operate in memory mode.

With reference now to FIGS. 5 and 6, these figures illustrate the two user defined modes of operation in exemplary CFB 10. In particular, FIG. 5 illustrates CFB 10 when configured to operate in logic mode, while FIG. 6 illustrates the same CFB 10 when configured to operate in memory mode. With reference to FIG. 5, when CFB 10 is configured by the user to operate in logic mode, volatile logic array 14 functions as high performance programmable logic. In operation, global interconnect matrix 90 selectively couples the desired input signals over bus 11 to the volatile logic array 14, which then performs the desired logical operations on the input signals.

In the embodiment shown in FIG. 5, up to twenty four input signals can be input into the block. Following the performance of the desired logical operations, up to ten sums of products ($SOP_1$–$SOP_{10}$) are coupled to up to ten macrocells ($Mcell_1$–$Mcell_{10}$). The sums of products are then coupled from the macrocells to the pin outs of the FPGA chip 100. Two global clock signals, CLK1 and CLK2, are available to clock the macrocells. Two asynchronous clock signals ACLK1 and ACLK2 are generated locally within volatile logic array (VLA) 14 and are also available to clock the macrocells. The control signals OE1, OE2, C/P1, and C/P2, are also generated within volatile logic array 14 and serve as control signals for the macrocells. In addition, an Identity Compare Block is provided, and is described in greater detail in copending U.S. Pat. No. 5,302,865, Issued Apr. 12, 1994, entitled High-Speed Comparator Logic For Wide Compares In Programmable Logic Devices.

Referring now to FIG. 6, this figure illustrates the same CFB 10 configured to operate as a block of SRAM. Initially, it can be observed from FIG. 6 that certain of the inputs are predefined to carry addresses, data, and control signals to the volatile logic array (VLA) 14 functioning as a block of SRAM. In particular, in the embodiment illustrated, seven of these inputs are predefined to be SRAM address lines, while an additional ten of these inputs are predefined to be SRAM data in lines. At least three of these inputs are predesignated to carry SRAM control signals, including Block Enable (BE), Output Enable (OE), and Write Enable (WE). (Four of the twenty four available inputs are not used in SRAM mode). These predesignated or set functions for particular inputs to CFB 10 operating in SRAM mode, can be contrasted to the user defined inputs for the same input signal lines when CFB 10 is operating in logic mode.

Figure 7:
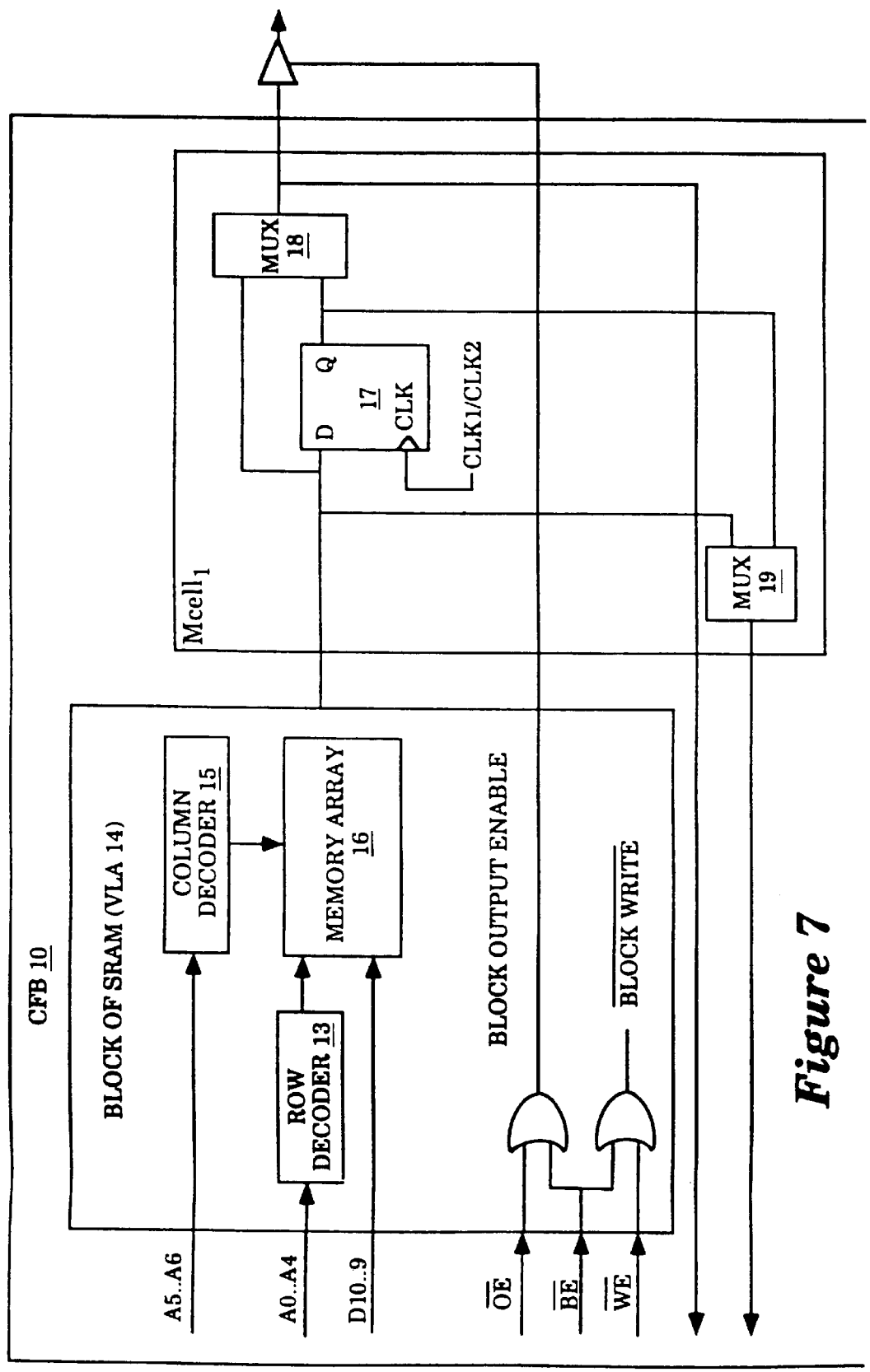
FIG. 7 illustrates, in greater detail, a configurable function block (CFB) of the present invention configured to operate in memory mode.

Referring now to FIG. 7, this figure illustrates, in greater detail, a particular embodiment of CFB 10 configured to operate as a block of SRAM. As shown, in this embodiment, five input signal lines are predefined to carry row address signals A0–A4, which are then coupled to a row decoder circuit 13. Two input signal lines are predefined to carry column address signals A5–A6 which are coupled to a column decoder circuit 15. In the embodiment shown, the block of SRAM available is thus comprised of thirty two rows, and four columns, yielding a memory array 16 having the dimensions 32×4×10 bits. Also shown in FIG. 7 is further detail on the composition of one of the ten macrocells, Mcell$_1$, coupled to the volatile logic array (VLA) 14. As illustrated, Mcell$_1$ includes a register 17 and two multiplexers 18 and 19. Multiplexer 18 provides the user with the option of bypassing register 17 and coupling the output of the volatile logic array (VLA) 14 functioning as a block of SRAM directly to the pin out. Multiplexer 19 provides for the selective coupling of feedback to the global interconnect matrix 90.

It will be appreciated by those skilled in the art that the particular transistor-level design of a configurable function block (CFB), configurable as either high performance programmable logic or a block of SRAM can take a variety of forms. In particular, the transistor-level design of such a CFB would be dictated by a number of factors including: the desired speed with which the CFB performs logic when in logic mode, the desired speed with which the CFB writes and reads the SRAM when in memory mode, the desired number of product terms in the CFB when in logic mode, the desired number of sums of products in the CFB when in logic mode, the availability of space in the CFB for particular transistor configurations, the overall area available for the CFB on the FPGA generally, as well as other design factors. Thus, the particular design chosen for the CFB's would depend upon the specification of each of these factors.

A number of design tradeoffs can also be noted. For example, a design which enhances the speed of the CFB in logic mode by decreasing the chip space dedicated to the SRAM cells, thereby causing a positive second order effect on the logic speed through reduced signal propagation, will have a tendency to sacrifice the speed of the SRAM to achieve faster logic speeds. On the other hand, a design which places paramount importance upon the speed of the SRAM will have a tendency to sacrifice the speed of the logic to achieve faster SRAM. Accordingly, while the description which follows will describe a particular transistor-level design for the configurable function block (CFB) of the present invention, dictated by a particular specification, it will be appreciated by one skilled in the art that the present invention is no way limited to this particular design.

Figure 8:
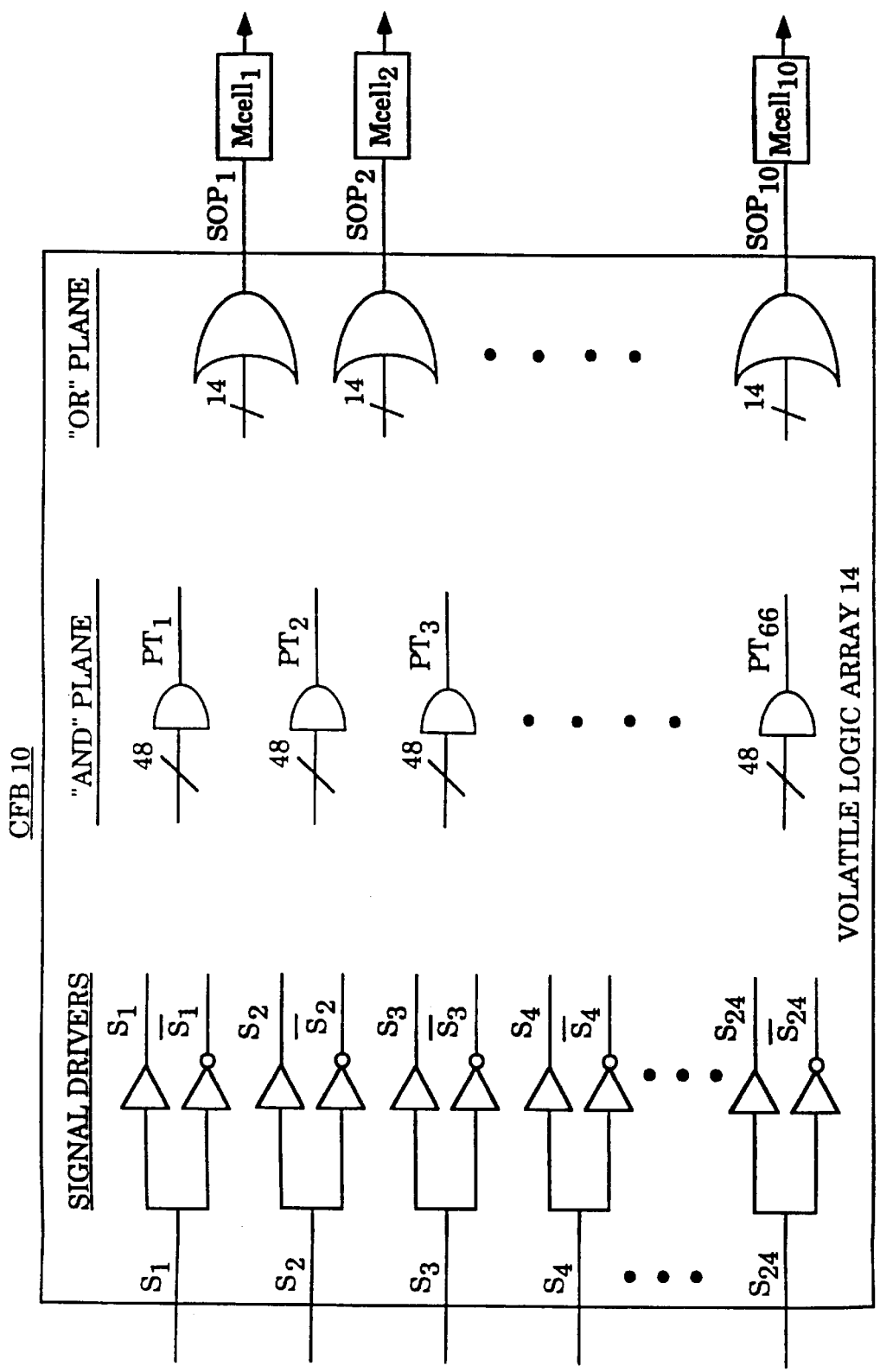
FIG. 8 illustrates, in simplified form, an embodiment of a configurable function block operating in logic mode with twenty-four possible inputs, sixty-six product terms, and ten outputs.

Referring now to FIG. 8, this figure illustrates, in simplified form, an embodiment of configurable function block (CFB) 10 in logic mode providing for twenty-four input signals, sixty-six product terms, and ten sums of product terms. As shown, the volatile logic array 14 includes: signal drivers, an "AND" plane, and an "OR" plane, which together support the execution of high performance programmable logic. In the array of signal drivers, each one of the twenty four input signals $S_1 \ldots S_{24}$ provided to volatile logic array 14 is coupled to two signal drivers, one which drives the signal, and another which drives the complement of the signal. For example, with reference to input signal $S_1$, a first signal driver drives $S_1$ to the "AND" plane, and a second signal driver drives the complement of $S_1$ to the "AND" plane. Accordingly, there are forty-eight signal drivers.

In the embodiment shown in FIG. 8, the "AND" plane produces sixty-six product terms, $PT_1-PT_{66}$. Each one of these product terms is produced by what can symbolically be depicted as an "AND" gate with forty-eight possible inputs and a single product term (PT) output. For each one of the sixty-six "AND" gates, the user selectively determines, through programming, which of the forty-eight possible inputs from the array of signal drivers will be coupled to that particular "AND" gate. Thus, for example, the user could decide that $PT_1$ will be the logical product of $S_1$, the complement of $S_3$, $S_4$, and the complement of $S_{24}$. Product terms $PT_1-PT_{66}$ are then coupled to the "OR" plane. Each "OR" gate in the "OR" plane has at least four product term inputs such that each Macrocell has at least four product terms associated with it. The selection of product term inputs is described in greater detail in copending U.S. patent application Ser. No. 07/954,308, filed Sep. 30, 1992, entitled "Apparatus and Method For Product Term Allocation and Programmable Logic."

Figure 9:
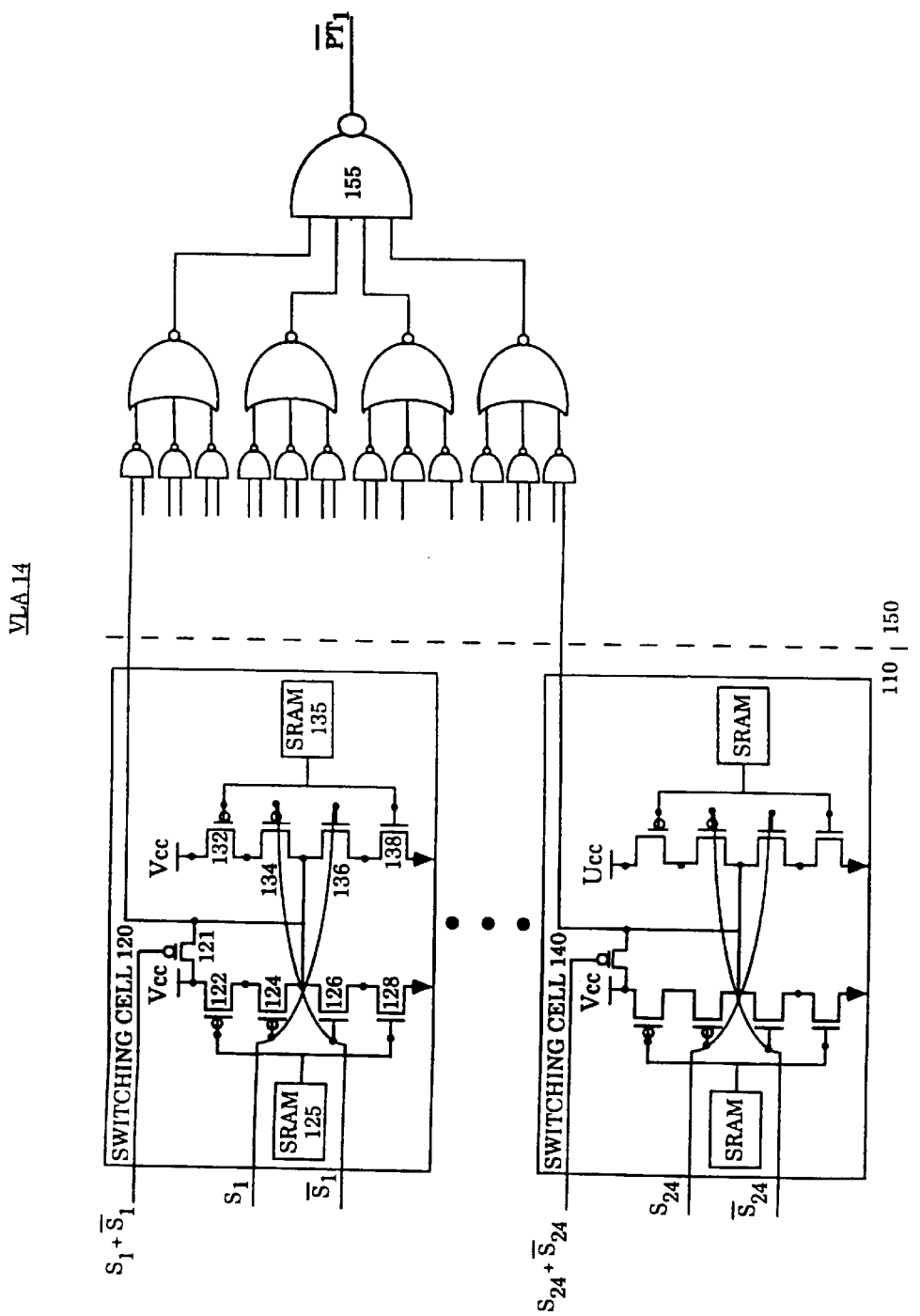
FIG. 9 illustrates the switching portion and the logic portion used to generate a single product term in the "AND" plane in a configurable function block of the present invention.

Referring now to FIG. 9, this figure illustrates the programmability of the "AND" plane through the use of switching cells incorporating SRAM cells. More particularly, FIG. 9 depicts the composition of a single one of the sixty-six symbolic "AND" gates illustrated in the "AND" plane of FIG. 8. (The other sixty-five gates are similarly structured.) As shown, the gate is comprised of a switching portion 110 and a logic portion 150. The logic portion 150 is comprised of twelve "NAND" gates, each with two inputs, coupled to four "NOR" gates, each with three inputs, coupled to a "NAND" gate 155 with four inputs and one output. It will be appreciated that through the above combination of logic gates, logic portion 150 effectively performs a "NAND" function on the twenty four inputs of logic portion 150.

Continuing to refer to FIG. 9, the switching portion 110 is comprised of twenty four switching cells which together determine which of the forty eight possible input signals (i.e. $S_1-S_{24}$ and the complements of $S_1-S_{24}$) will be coupled to the aforementioned "AND" function. FIG. 9, it will be appreciated, illustrates only two (the first and the last) of these twenty four identical switching cells, switching cell 120 and switching cell 140. It can be observed that each switching cell comprises two TRI-NOT configurations of CMOS transistors with their outputs tied together, a single P-channel MOSFET, two SRAM cells, three signal inputs, and one switched output.

Switching cell 120, for example, comprises a first TRI-NOT configuration with two serially connected P-channel MOSFET transistors 122, and 124, connected to two serially connected N-channel MOSFET transistors 126 and 128, and a similar TRI-NOT configuration with two serially connected P-channel MOSFET transistors 132, and 134, connected to two serially connected N-channel MOSFET transistors 136 and 138. The outputs of these two TRI-NOT configurations are coupled together and provide for the output of switching cell 120, which is then coupled to one of the twenty-four inputs of logic portion 150. In addition, P-channel MOSFET 121 couples the output of the two TRI-NOTS directly to $V_{cc}$ under the control of the gate signal $S_1$+ the complement of $S_1$. The SRAM cells 125 and 135 store bits which determine whether the output of switching cell 120 is $S_1$, the complement of $S_1$, or what can be termed a "don't care." As shown, SRAM cell 125 is coupled to the gates of transistors 122 and 128 while SRAM cell 135 is coupled to the gates of transistors 132 and 138. In addition, $S_1$ is coupled to the gates of transistors 124 and 136, while the complement of $S_1$ is coupled to the gates of transistors 126 and 134.

In accordance with the method of operation of switching cell 120, the contents of SRAM cells 125 and 135 directly determine whether the output of the switching cell will be $S_1$, the complement of $S_1$, or a "don't care." In order to couple $S_1$ to the output of switching cell 120, a logical one is placed in SRAM cell 125, and a logical zero is placed in SRAM cell 135. To couple the complement of $S_1$ to the output of switching cell 120, a logical zero is placed in SRAM cell 125 and a logical one is placed in SRAM cell 135. Lastly, to produce a "don't care" output, logical zeroes are placed in both SRAM cell 125 and SRAM cell 135. This produces a logical one output for switching cell 120 at all times. It will be appreciated that this unchanging logical one output will be coupled to the NAND gate in logical portion 150, effectively constituting a "don't care" signal to this gate, the output of which will now be determined exclusively by the other input to this two input NAND gate. In this way, SRAM cells 125 and 135 can be programmed to programmably determine the output of switching cell 120. In addition, transistor 121 ensures that the output will remain in the "don't care" state when both $S_1$ and $S_2$ are at a logic zero (as is the case during read or verification operations) even if both SRAM cells (125 and 135) are at a logic one.

Figure 10:
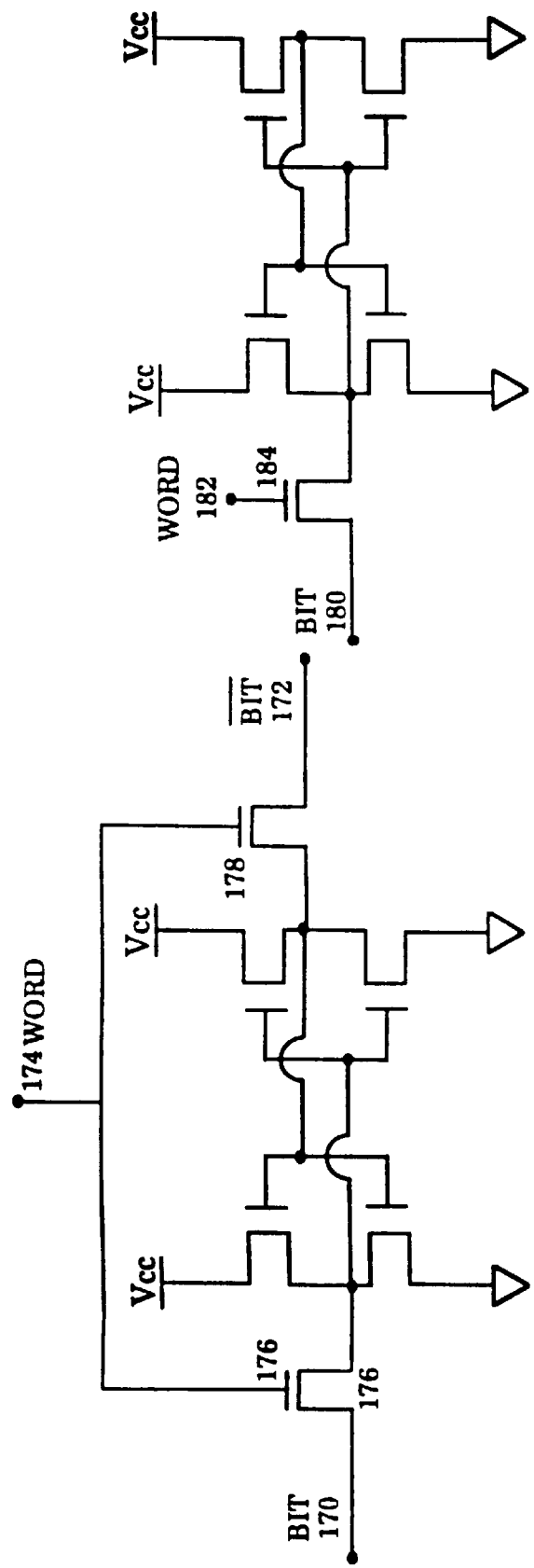
FIGS. 10a and 10b illustrate two of the many possible SRAM cell designs which could be used in conjunction with a configurable function block of the present invention.

Referring now to FIGS. 10A and 10B, these figures illustrate two of the many possible SRAM cells which can be utilized in the previously described SRAM cells 125 and 135. In particular, FIG. 10A illustrates a symmetrical SRAM cell, while FIG. 10B illustrates an asymmetrical SRAM cell. As shown in FIG. 10A, the symmetrical SRAM cell has a first bit line 170, and a second complementary bit line 172, with a word line 174 coupled to pass gate 176 and pass gate 178. In contrast, referring to FIG. 10B, the asymmetrical SRAM cell has a single bit line 180, with a word line 182 coupled to a single pass gate 184. It will be appreciated, that the asymmetrical SRAM cell takes up less chip space than the symmetrical SRAM cell. In addition, the asymmetrical SRAM cell does not require topological balance, and is therefore, more amenable to placement in smaller, irregular areas in the chip architecture. On the other hand, because the asymmetrical SRAM cell is not balanced, it is generally slower to write to, and not as easily read from, than the symmetrical SRAM cell.

Accordingly, when the speed with which the CFB operates in logic mode is of paramount importance, the design of the CFB can advantageously incorporate an asymmetrical SRAM cell design. The savings in chip space provided by the smaller asymmetrical SRAM cell design has a positive second order effect on the propagation speeds of the logic. On the other hand, when the speed with which the CFB operates in memory mode is of paramount importance, the design of the CFB can advantageously incorporate a symmetrical SRAM cell design. While such a design incorporating symmetrical SRAM cells does not necessarily provide for the fastest logic when the CFB is in logic mode, such a CFB can still provide for more than adequate logic performance in many applications.

Figure 11:
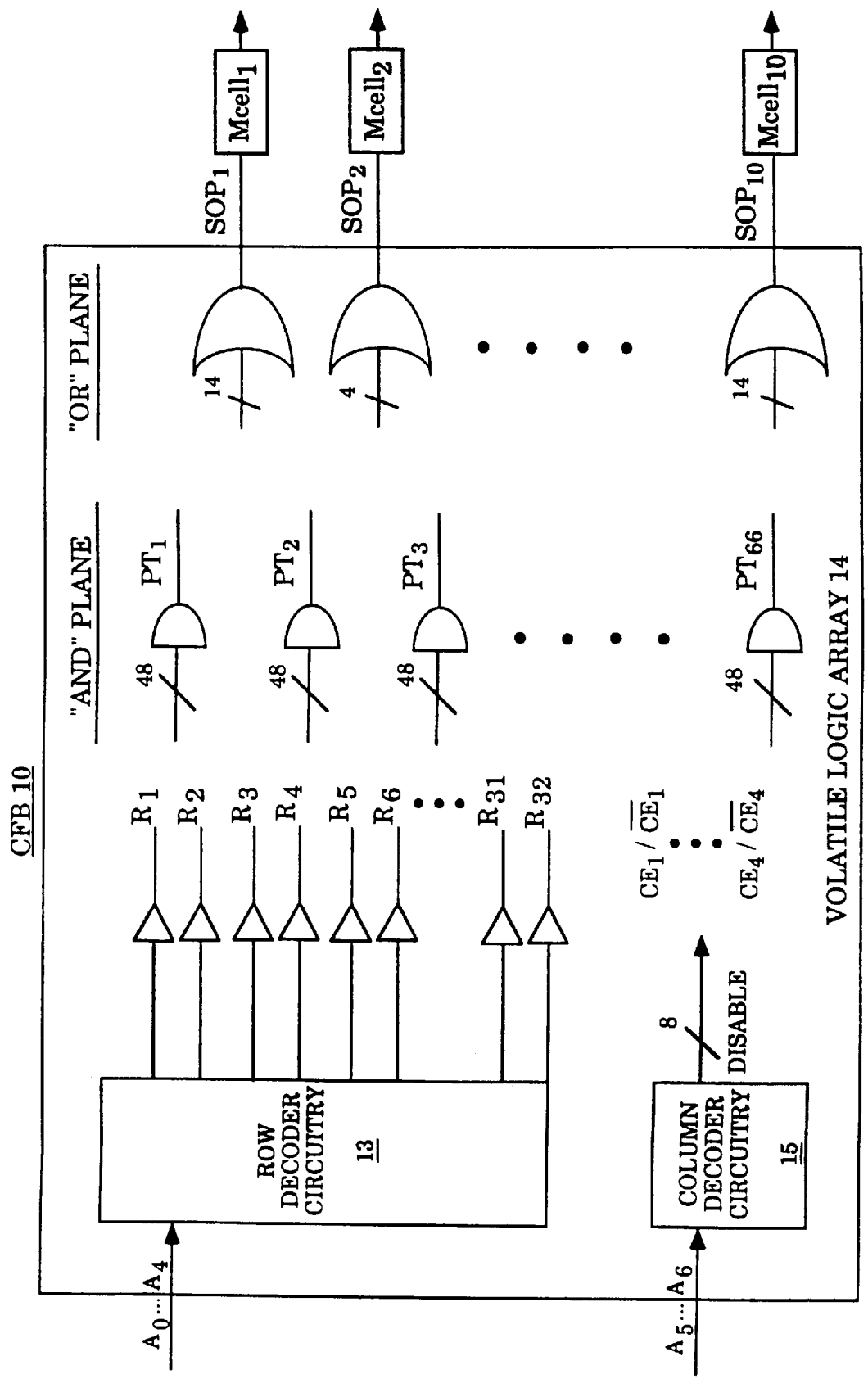
FIG. 11 illustrates the different way in which the input to the volatile logic array is handled in memory mode.
Figure 12:
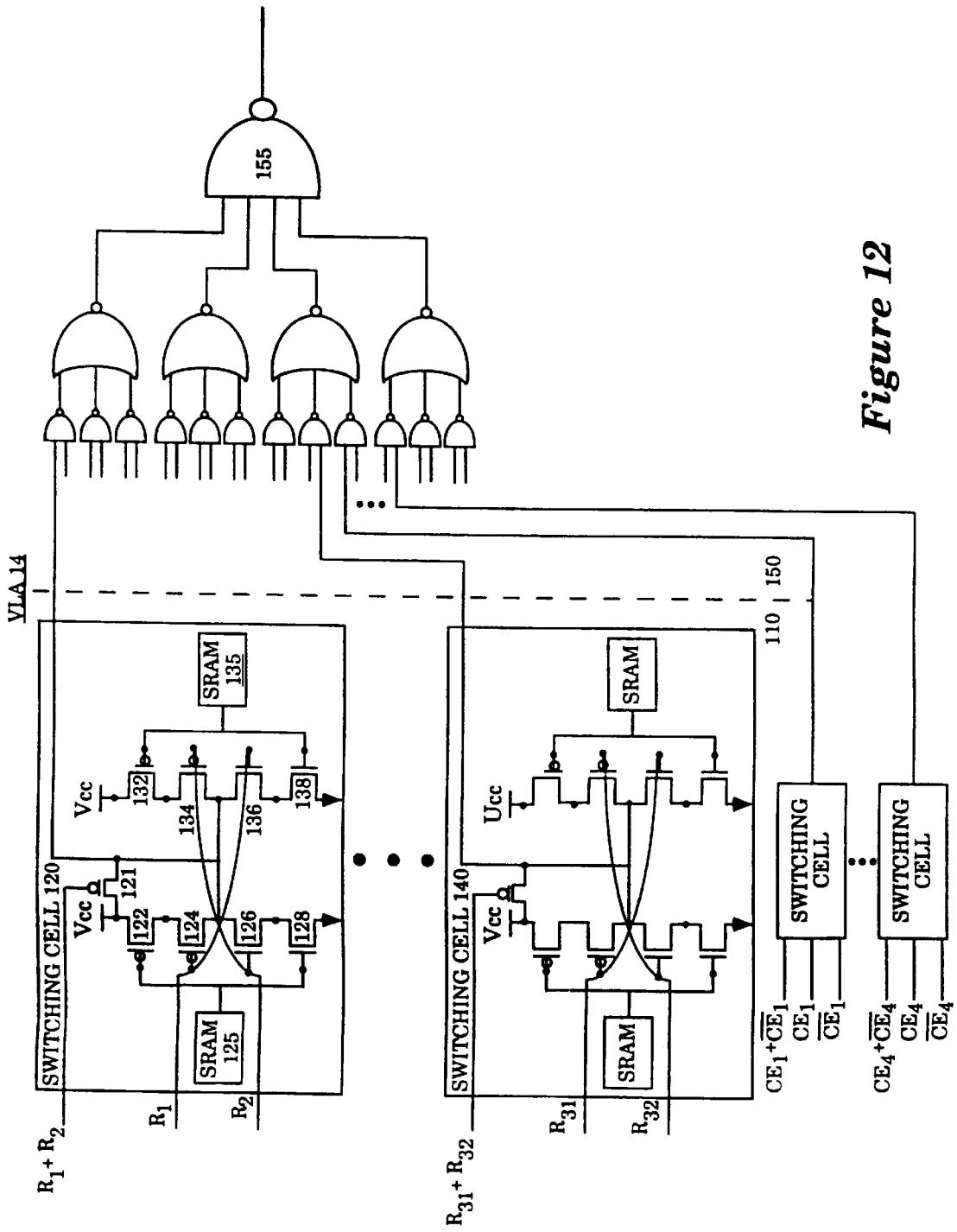
FIG. 12 illustrates the signals provided to the switching portion and the logic portion of a single product term in the "AND" plane when in memory mode.
Figure 13:
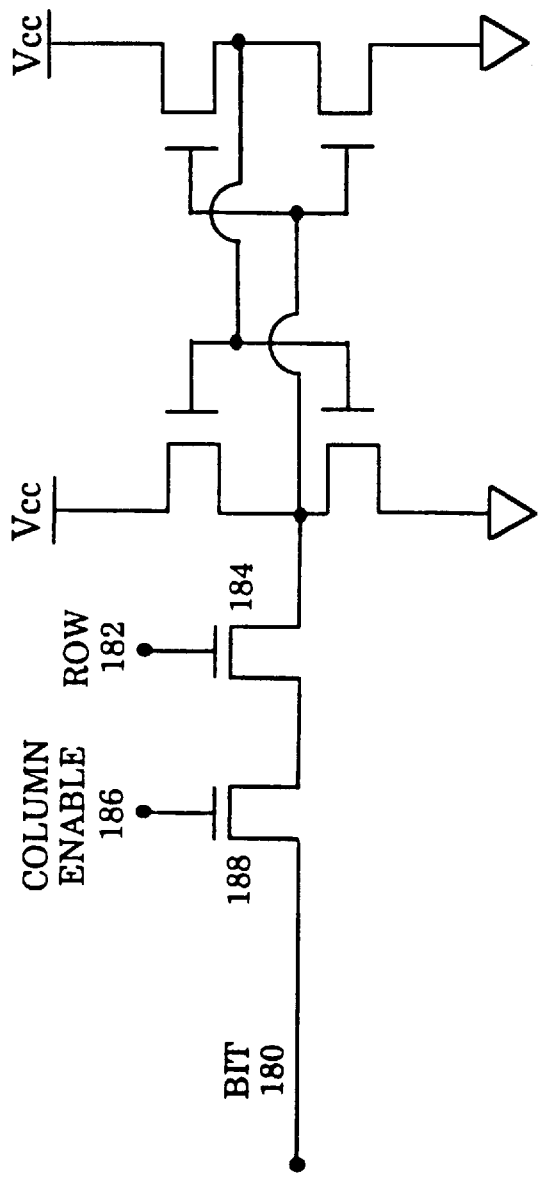
FIG. 13 illustrates the SRAM cell design used in conjunction with the particular embodiment of the configurable function block discussed.

Referring now to FIGS. 11, 12, and 13, these figures illustrates the means utilized to operate configurable function block (CFB) 10 as a block of SRAM. With reference to FIG. 11, as described earlier, in memory mode, five input signal lines are predefined to carry row address signals A0–A4. In memory mode, A0–A4 are coupled to a specialized row decoder circuit 13. Two input signal lines are predefined to carry column address signals A5–A6, which are coupled to a specialized column decoder circuit 15. Continuing to refer to FIG. 11, row decoder circuit 13 has thirty-two outputs which carry row signals ($R_1$–$R_{32}$). These thirty-two output lines are then coupled as inputs to each of the "AND" gates in the "AND" plane. It can be noted that in contrast to the forty-eight signals coupled to each of the "AND" gates in logic mode, the thirty-two signals coupled to each of the "AND" gates in memory mode do not include complementary signals. Also from FIG. 11, column decoder circuit 15 produces 4 column enable signals ($CE_1$ through $CE_4$) and their complements. Thus, referring to FIG. 12, it can be observed that the 32 row decoder outputs and the 8 column decoder outputs are connected to 20 of the 24 switching cells on each product term. The 4 unused switching cells have both their SRAM cells set at a logic zero, thus ensuring they are "don't care" inputs to the product term while in SRAM mode.

With reference now to FIGS. 11 and 12, an SRAM read operation of volatile logic array 14 is accomplished through the selective manipulation of row signals $R_1$–$R_{32}$, and column enable signals from column decoder circuitry 15. A particular row address is specified by the row address signals A0–A4, which are provided to row decoder circuit 13. In response to the specification of a particular row, row decoder circuit 13 selectively sets thirty-one of the thirty-two row signals low, while leaving only one of the row signals, the one corresponding to the selected row, high. With reference to FIG. 12, this causes fifteen of the sixteen switching cells to go high. These fifteen inputs to logic portion 150, thus, become "don't care" signals. The sixteenth input to logic portion 150, it will be appreciated, corresponds to the selected row, and exclusively determines the state of $PT_1$. The contents of the SRAM for this row can then be determined from the state of $PT_1$.

Continuing to refer to FIGS. 11 and 12, it will be appreciated that the specification of a particular row yields sixty-six product terms which are then inputted into the "OR" plane. As described earlier, each "OR" gate in the "OR" plane has at least four product term inputs. These four product term inputs correspond to columns as follows. A particular column address is specified by the column address signals A5–A6 which are coupled to column decoder circuit 15. In response to the specification of a particular column, column decoder circuit 15 selectively disables three of the four product term inputs into each "OR" gate in the "OR" plane. This is accomplished by selectively enabling one of the four CE inputs on each set of four product terms. Since the CE signals are complementary, each product term performs a logical AND of the selected SRAM data and its CE input. Thus, three of the four product terms AND their SRAM data with CE signals which are at a logic zero (producing a logic zero result), while one product term ANDs its SRAM data with a logic one (producing the SRAM data as a result). In this way, only a single column of the four possible columns inputted into each "OR" gate is chosen. Thus, with both the row and the column selected, ten selected SRAM bits are outputted into $Mcell_1$–$Mcell_{10}$, and the read is completed.

In order to provide for a write operation of the SRAM in volatile logic array 14, a particular SRAM cell shown in FIG. 13 can be utilized. The SRAM cell design in FIG. 13 is similar to the asymmetrical cell design shown in FIG. 10b with the addition of a second pass gate 188, in series with pass gate 184, with a column enable line 186. In a write operation directed to particular SRAM cells, data is written directly to the SRAM cells over the bit line 180. The use of two pass gates then provides for the selective enablement of particular rows with one pass gate, and the selective enablement of particular columns with the second pass gate.

Figure 14:
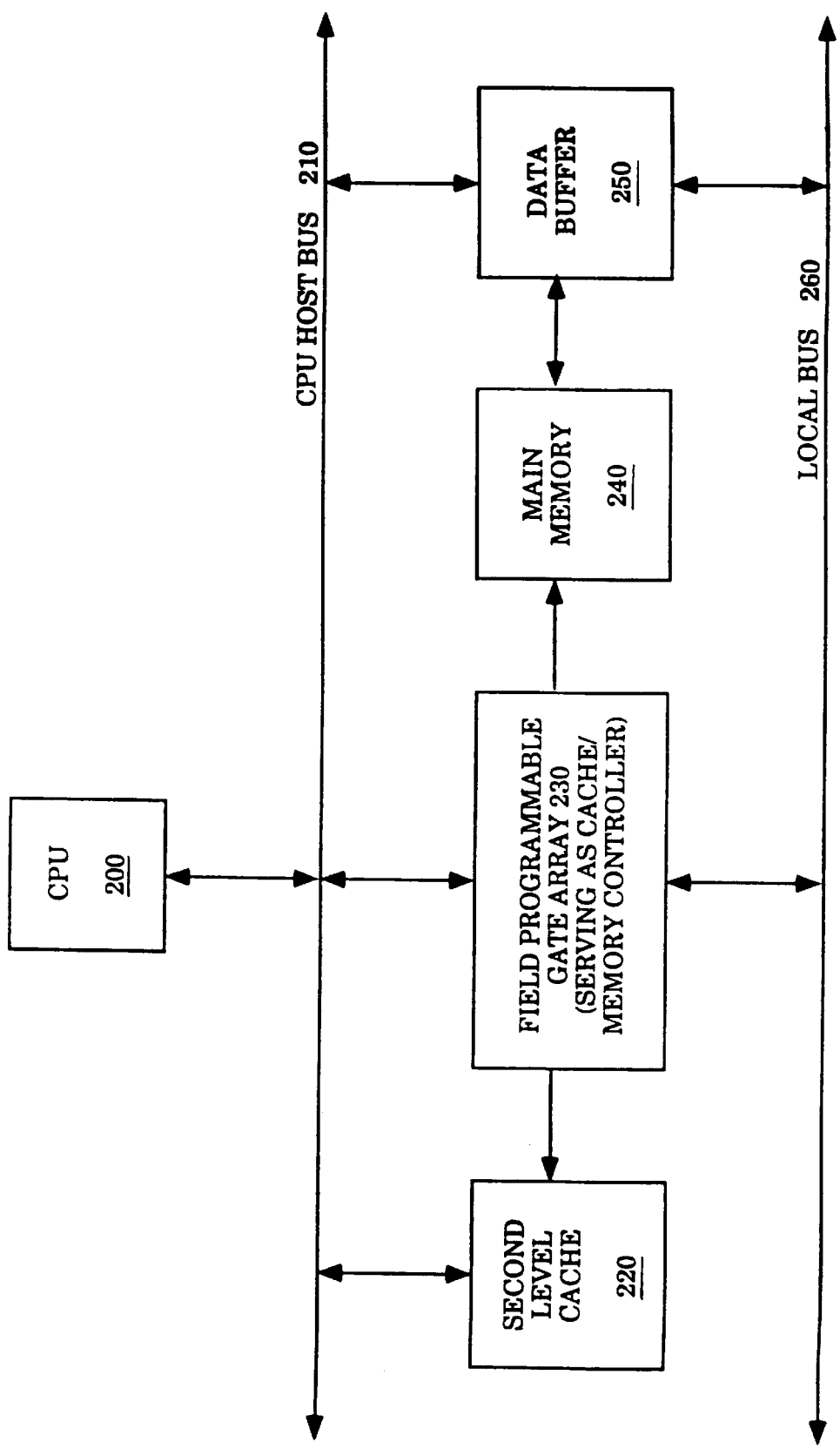
FIG. 14 illustrates the use of the field programmable gate array as a cache/memory controller.

It will be appreciated that a field programmable gate array incorporating the apparatus and method of the present invention can be used in a virtually unlimited number of applications. Some of these applications might include for example, use as a cache/memory controller, bridge or glue logic, look-up table logic, stack or FIFO storage, a scratch pad RAM, an initialization PROM, or a micro-sequencer. Two such applications are depicted in FIGS. 14 and 15. While these figures illustrate two advantageous applications for the field programmable gate array of the present invention, these figures should not be interpreted in any way as limiting the scope of the present invention.

Referring now to FIG. 14, this figure illustrates the use of the field programmable gate array as a cache/memory controller. The system shown includes a CPU 200, a CPU host bus 210, a second level cache memory 220, the field programmable gate array of the present invention 230, a main memory 240, for example, comprising DRAM, a data buffer 250, and a local bus 260. As shown, the CPU 200, the second level external cache memory 220, the field programmable gate array 230, and the data buffer 250 are all coupled to the CPU host bus 210. In addition, the field programmable gate array 230 and the data buffer 250 are also coupled to the local bus 260. In the system shown, the field programmable gate array 230 is programmed such that it controls accesses of both the second level cache memory 220 and main memory 240. With reference to FIG. 15, this figure illustrates the use of the field programmable gate array 230 as a bridge between the local bus 260 and an electronic component 270 requiring some bridge or glue logic to interface to the local bus 260. In this application, the field programmable gate array is advantageously programmed to serve as glue logic.

While the present invention has been particularly described with reference to FIGS. 1 through 15, it should be understood that these figures are for illustration only and should not be taken as limitations upon the invention. It is further contemplated that many changes and modifications may be made to the invention, by one of ordinary skill in the art, without departing from the spirit and scope of the invention as disclosed herein. In particular, as earlier described, the present invention is in no way limited to the particular embodiment described herein. More specifically, the present invention is not limited to the particular number of product terms, sums of product's, SRAM cells, particular memory array size, or overriding emphasis upon logic performance dictating the use of asymmetrical SRAM cells. With respect to the size of the memory array, sizes such as 32×6×8, or 32×8×6, are readily accommodated in the design described. It is further contemplated that the size of the memory array itself can be configurable. Alternatively, the design of the FPGA chip can be such that the size of the memory array more closely corresponds to SRAM sizes presently on the market.

We claim:

1. A configurable function block comprising:

input means for inputting input signals to said configurable function block;

output means for outputting output signals from said configurable function block;

means for operating said configurable function block as programmable logic to perform at least one predetermined logic operation on said input signals, wherein said means for operating said configurable function block as programmable logic includes a plurality of preconfigured SRAM cells coupled to a plurality of logic gates;

means for operating said configurable function block as a block of memory, wherein said means for operating said configurable function block as a block of memory includes means for reading data from, and writing data to, said plurality of preconfigured SRAM cells.

2. The configurable function block as recited in claim 1, wherein said plurality of logic gates comprises an array of logical "AND" gates.

3. The configurable function block as recited in claim 2, wherein said plurality of logic gates further comprises an array of logical "OR" gates coupled to said array of logical "AND" gates.

4. The configurable function block as recited in claim 1, wherein said plurality of preconfigured SRAM cells comprises symmetrical SRAM cells.

5. The configurable function block as recited in claim 1, wherein said plurality of preconfigured SRAM cells comprises asymmetrical SRAM cells.

6. The configurable function block as recited in claim 1, wherein said means for operating said configurable function block as programmable logic further comprises a non-volatile architectural element coupled to said plurality of preconfigured SRAM cells.

7. A configurable function block comprising:

input means for inputting input signals to said configurable function block;

output means for outputting output signals from said configurable function block;

a volatile logic array comprising:

a plurality of OR gates, said plurality of OR gates coupled to said output means;

a plurality of AND gates, said plurality of AND gates coupled to said plurality of OR gates;

switching cell means coupled to said input means and said plurality of AND gates for programmably determining which of said input signals will be coupled to said plurality of AND gates, wherein said switching cell means comprises a plurality of preconfigured SRAM cells;

means for operating said volatile logic array as a block of SRAM such that data can be written to, and read from, said plurality of preconfigured SRAM cells.

8. The configurable function block as recited in claim 7, wherein said plurality of preconfigured SRAM cells comprises symmetrical SRAM cells.

9. The configurable function block as recited in claim 7, wherein said plurality of preconfigured SRAM cells comprises asymmetrical SRAM cells.

10. The configurable function block as recited in claim 7, wherein said configurable function block further comprises a non-volatile architectural element coupled to said volatile logic array for programming said switching cell means.

11. A field programmable gate array with at least one configurable function block configurable by a user of the field programmable gate array as programmable logic or a block of memory, said field programmable gate array comprising:

global interconnect matrix means having an input and a first output bus, wherein said global interconnect matrix selectively couples signals from said input to said first output bus;

a first configurable function block, coupled to said first output bus of said global interconnect matrix, said first configurable function block comprising:

output means for outputting output signals from said first configurable function block;

means for operating said first configurable function block as programmable logic to perform at least one predetermined logic operation on said signals coupled to said first configurable function block over said first output bus, wherein said means for operating said first configurable function block as programmable logic includes a first plurality of preconfigured SRAM cells coupled to a first plurality of logic gates;

means for operating said first configurable function block as a block of memory, wherein said means for operating said first configurable function block as a block of memory includes means for reading data from, and writing data to, said first plurality of preconfigured SRAM cells.

12. The field programmable gate array as recited in claim 11, wherein said first plurality of logic gates comprises an array of logical "AND" gates.

13. The field programmable gate array as recited in claim 12, wherein said first plurality of logic gates further comprises an array of logical "OR" gates coupled to said array of logical "AND" gates.

14. The field programmable gate array as recited in claim 11, wherein said first plurality of preconfigured SRAM cells comprise symmetrical SRAM cells.

15. The field programmable gate array as recited in claim 11, wherein said first plurality of preconfigured SRAM cells comprise asymmetrical SRAM cells.

16. The field programmable gate array as recited in claim 15, wherein said asymmetrical SRAM cells include a first pass gate and a second pass gate.

17. The field programmable gate array as recited in claim 11, wherein said means for operating said first configurable function block as programmable logic further comprises a non-volatile architectural element coupled to said first plurality of preconfigured SRAM cells.

18. The field programmable gate array as recited in claim 11, wherein said global interconnect matrix means further comprises a second output bus and said global interconnect matrix additionally selectively couples signals from said input to said second output bus, and said field programmable gate array further comprises:

a second configurable function block, coupled to said second output bus of said global interconnect matrix, said second configurable function block comprising:

output means for outputting output signals from said second configurable function block;

means for operating said second configurable function block as programmable logic to perform at least one predetermined logic operation on said signals coupled to said second configurable function block over said second output bus, wherein said means for operating said second configurable function block as programmable logic includes a second plurality of preconfigured SRAM cells coupled to a second plurality of logic gates;

means for operating said second configurable function block as a block of memory, wherein said means for operating said second configurable function block as a block of memory includes means for reading data from, and writing data to, said second plurality of preconfigured SRAM cells.

19. A method for operating a configurable function block having a volatile logic array comprising a plurality of preconfigured SRAM cells coupled to a plurality of logic gates, and a non-volatile architectural element, said method comprising the steps of:

deciding whether to configure the configurable function block as programmable logic or a block of SRAM;

in the event of a decision to configure said configurable function block as a block of SRAM, writing data to, and reading data from, said plurality of preconfigured SRAM cells;

in the event of a decision to configure said configurable function block as programmable logic, programming at least one logical equation into said configurable function block, and utilizing said plurality of preconfigured SRAM cells and said plurality of logic gates to perform said at least one logical equation.

20. The method for operating a configurable function block as provided in claim 19, wherein said programming at least one logical equation into said configurable function block comprises:

programming said at least one logical equation into said non-volatile architectural element;

transferring said at least one logical equation from said non-volatile architectural element into said plurality of preconfigured SRAM cells.

21. A computer system comprising:

a CPU;

a cache memory coupled to said CPU;

a programmable logic device coupled to said CPU and said cache memory, said programmable logic device controlling accesses to said cache memory, said programmable logic device comprising:

an input for inputting input signals to said programmable logic device;

an output for outputting output signals from said programmable logic device;

a volatile logic array comprising:

a plurality of OR gates, said plurality of OR gates coupled to said output;

a plurality of AND gates, said plurality of AND gates coupled to said plurality of OR gates;

a plurality of preconfigured SRAM cells coupled to said input and said plurality of AND gates for programmably determining which of said input signals will be coupled to said plurality of AND gates;

means for operating said volatile logic array as a block of SRAM such that data can be written to, read from, and stored in said plurality of preconfigured SRAM cells.

22. The computer system as recited in claim 21, wherein said plurality of preconfigured SRAM cells comprise symmetrical SRAM cells.

23. The computer system as recited in claim 22, wherein said plurality of preconfigured SRAM cells comprise asymmetrical SRAM cells.

24. The computer system as recited in claim 21, wherein said programmable logical device further comprises a non-volatile architectural element coupled to said volatile logic array for programming said switching cell means.

25. A computer system comprising:

CPU means;

cache memory means coupled to said CPU means;

programmable logic means coupled to said CPU means and said cache memory means, said programmable logic means controlling accesses to said cache memory means, said programmable logic means comprising:

input means for inputting input signals to said programmable logic device;

output means for outputting output signals from said programmable logic device;

volatile logic array means comprising:

a plurality of OR gates, said plurality of OR gates coupled to said output means;

a plurality of AND gates, said plurality of AND gates coupled to said plurality of OR gates;

switching cell means coupled to said input means and said plurality of AND gates for programmably determining which of said input signals will be coupled to said plurality of AND gates, wherein said switching cell means comprises a plurality of preconfigured SRAM cells;

means for operating said volatile logic array as a block of SRAM such that data can be written to, and read from, and stored in said plurality of preconfigured SRAM cells.

26. The computer system as recited in claim 25, wherein said plurality of preconfigured SRAM cells comprise symmetrical SRAM cells.

27. The computer system as recited in claim 26, wherein said plurality of preconfigured SRAM cells comprise asymmetrical SRAM cells.

28. The computer system as recited in claim 25, wherein said programmable logical device further comprises a non-volatile architectural element coupled to said volatile logic array means for programming said switching cell means.

\* \* \* \* \*